United States Patent [19]
Miyaji et al.

[11] Patent Number: 6,037,837
[45] Date of Patent: Mar. 14, 2000

[54] FEED FORWARD AMPLIFIER

[75] Inventors: Masayuki Miyaji, Takarazuka; Kaoru Ishida, Shijonawate; Hiroaki Kosugi, Hirakata; Shin'ichi Kugou, Yokohama, all of Japan

[73] Assignee: Matsushita Electric Industrial Co., Ltd., Osaka, Japan

[21] Appl. No.: 09/245,681

[22] Filed: Feb. 8, 1999

[30] Foreign Application Priority Data

Feb. 9, 1998 [JP] Japan .................................. 10-027571

[51] Int. Cl.[7] ...................................................... H03F 1/26
[52] U.S. Cl. ............................................ 330/149; 330/151
[58] Field of Search .............................. 330/124 R, 149, 330/151

[56] References Cited

U.S. PATENT DOCUMENTS

| | | | |
|---|---|---|---|
| 4,217,554 | 8/1980 | Brzozowski | 330/124 R |
| 5,043,673 | 8/1991 | Suematsu et al. | 330/149 |
| 5,631,604 | 5/1997 | Dent et al. | |
| 5,644,268 | 7/1997 | Hang | |
| 5,691,668 | 11/1997 | Yoshikawa et al. | 330/151 |
| 5,815,036 | 9/1998 | Yoshikawa et al. | 330/52 |

FOREIGN PATENT DOCUMENTS

| | | |
|---|---|---|
| 0 443 368 | 8/1991 | European Pat. Off. . |
| 0 552 059 | 7/1993 | European Pat. Off. . |
| 8-32358 | 2/1996 | Japan . |
| 2697618 | 9/1997 | Japan . |

OTHER PUBLICATIONS

European Search Report corresponding to application No. EP 99 10 2396 dated May 26, 1999.

*Primary Examiner*—Robert Pascal
*Assistant Examiner*—Henry Choe
*Attorney, Agent, or Firm*—Ratner & Prestia

[57] ABSTRACT

A feed forward amplifier comprises a main amplifier 10 composed of a plurality of power amplifiers 8 and 9 combined in parallel. In addition to the plurality of power amplifiers, this feed forward amplifier includes a distortion detecting amplifier 25 for detecting the distortion components, having a distortion characteristic in a predetermined relationship with the distortion characteristic of the main amplifier. It also omits a distortion detecting power combiner 23 otherwise located after a main amplifier 10 and locates a delay circuit 21 before the main amplifier 10 to reduce losses occurring after the main amplifier 10 to improve the efficiency of the entire feed forward amplifier.

20 Claims, 7 Drawing Sheets

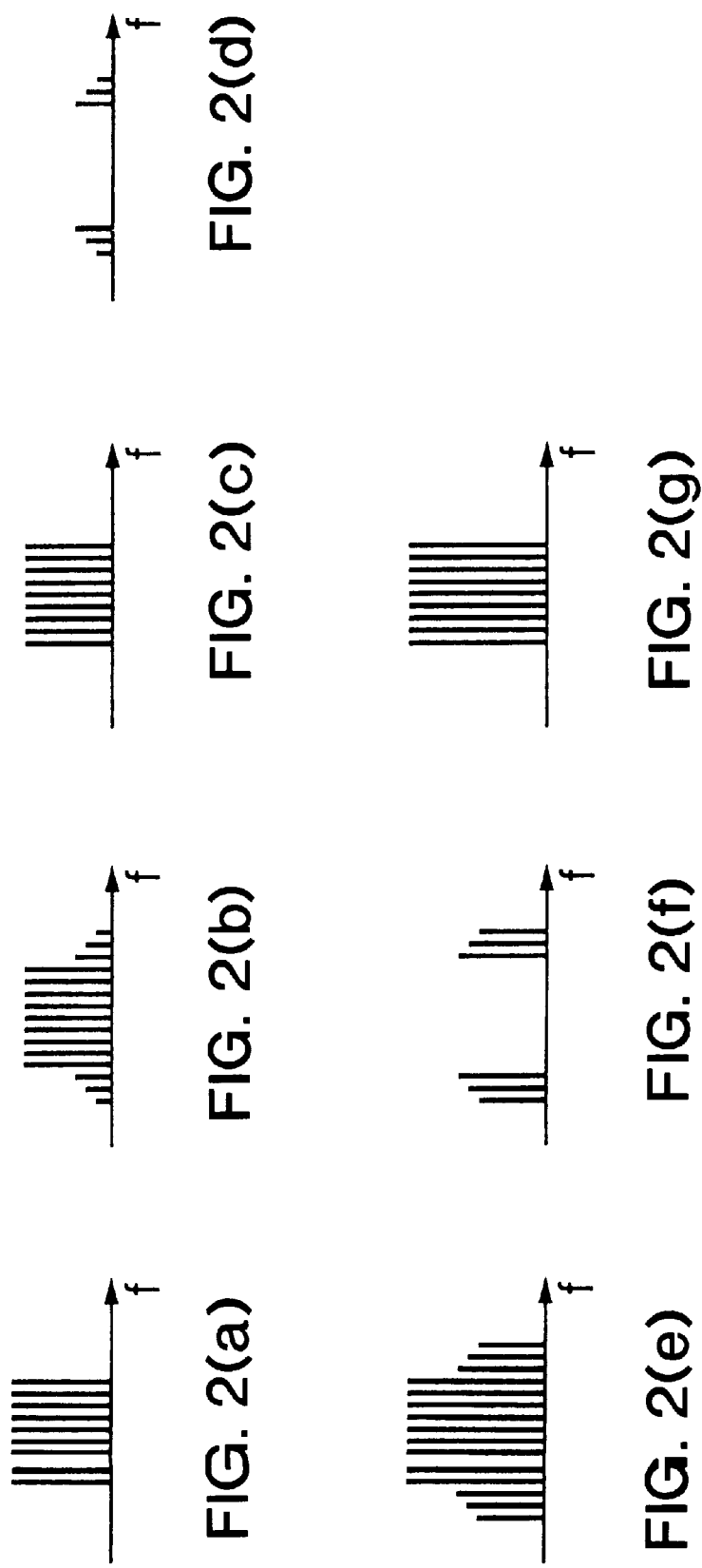

FEED FORWARD AMPLIFIER

BACKGROUND OF THE INVENTION

1. Field of the Invention

The present invention relates to a feed forward amplifier used for a base station for mobile communication equipment.

2. Description of the Related Art

In recent years, power amplifiers providing higher outputs and better linearity have been required for base stations for mobile communication equipment. Despite this demand for high outputs, no power amplifiers have been developed yet that enable a single device to output several hundred W, so a plurality of power amplifiers are combined in parallel to meet this demand. The linearity has been realized by providing distortion compensation based on the feed forward method.

FIG. 6 shows an example of a configuration of a conventional feed forward amplifier. In this figure, 1 is an input terminal, 2 is an output terminal, 3 and 6 are power dividers, 4 is a distortion canceling power combiner, 5 and 14 are vector adjusters, 7 is an output power combiner, 8 and 9 are power amplifiers, 11 and 13 are delay circuits, 12 is a distortion detecting power combiner, and 15 is an auxiliary amplifier. The power divider 6, the output power combiner 7, and the power amplifiers 8 and 9 constitute a main amplifier 10. In addition, references (a) to (j) added to the power divider 3, the distortion canceling power combiner 4, and the distortion detecting power combiner 12 designate ports.

The operation of the feed forward amplifier of this configuration is described below.

First, the power divider 3 divides into two an input signal (see FIG. 7(a)) input from the input terminal 1 and containing multi-channel components. One of the divided output signals is transferred via the vector adjuster 5 to the main amplifier 10, which then amplifies this signal. The amplified signal is input to the port (d) of the distortion detecting power combiner 12 (see FIG. 7(b)). Due to non-linearity of the main amplifier 10, the input signal (see FIG. 7(b)) contains not only the input signal components but also distortion components resulting from inter-modulation. In addition, the other divided signal is input to the port (e) of the distortion detecting power combiner 12 through the delay circuit 11. By adjusting the vector adjuster 5 and the delay circuit 11 so that the input signal components of the signals input to the ports (d) and (e) have an equal amplitude and opposite phases, a signal consisting of only the distortion components due to the canceled input signal components (see FIG. 7(c)) is output from the port (g).

Next, a signal output from the port (f) and containing both the input signal components and the distortion components is input to the port (h) of the distortion canceling power combiner 4 via the delay circuit 13. In addition, the signal with the distortion components output from the port (g) is transferred via the vector adjuster 14 to the auxiliary amplifier 15, which then amplifies this signal. The amplified signal is then input to the port (i) of the distortion canceling power combiner 4. By adjusting the vector adjuster 14 and the delay circuit 13 so that the distortion components of the signals input to the ports (h) and (i) have an equal amplitude and opposite phases, a signal consisting of only the input signal components due to the canceled distortion components (see FIG. 7(d)) is output from the port (j) to the output terminal 2.

FIGS. 7(a) to 7(d) show the frequency spectra of the signals at the ports (a), (d), (g), and (j) of FIG. 6.

In this configuration, however, the output power of the main amplifier 10 decreases due to losses in the distortion detecting power combiner 12 and delay circuit 13 to reduce the efficiency of the entire feed forward amplifier.

BRIEF SUMMARY OF THE INVENTION

In view of the conventional problem of reduced efficiency, it is an object of this invention to provide an efficient feed forward amplifier that can avoid losses in the distortion detecting power combiner and delay circuit.

One aspect of the present invention is a feed forward amplifier comprising:

a first power divider for dividing an input signal into two, a first delay circuit for delaying one of the output signals from the first power divider, a main amplifier having one power amplifier or a plurality of power amplifiers connected in parallel to amplify an output signal from said first delay circuit, a second power divider for dividing the other output signal from said first power divider into two, a first vector adjuster for adjusting an amplitude and phase of one of output signals from the second power divider, a distortion detecting amplifier for amplifying an output signal from the first vector adjuster, a second delay circuit for delaying the other output signal from the second power divider, a distortion detecting power combiner for combining an output signal from said distortion detecting amplifier and an output signal from said second delay circuit, and for outputting distortion components, a second vector adjuster for adjusting an amplitude and phase of an output signal from the distortion detecting power combiner, and a distortion canceling power combiner for canceling distortion components from the output signal from said main amplifier based on the output signal from said second vector adjuster.

Another aspect of the present invention is a feed forward amplifier according to the first invention comprising an auxiliary amplifier for amplifying the output signal from said second vector adjuster to output the amplified signal to said distortion canceling power combiner, wherein:

said canceling distortion components from the output signal from said main amplifier based on the output signal from said second vector adjuster means canseling distortion components from the output signal from said main amplifier by using said output signal from said auxiliary amplifier.

Still another aspect of the present invention is a feed forward amplifier comprising:

a first power divider for dividing an input signal into two, a first delay circuit for delaying one of the output signals from the first power divider, a second power divider for dividing the other output signal from said first power divider into two, a first vector adjuster for adjusting an amplitude and phase one of output signals from the second power divider, a distortion detecting amplifier for amplifying an output signal from the first vector adjuster, a second delay circuit for delaying the other output signal from the second power divider, a distortion detecting power combiner for combining an output signal from said distortion detecting amplifier and an output signal from said second delay circuit, and for outputting distortion components, a second vector adjuster for adjusting an amplitude and phase of an output signal from the distortion detecting power combiner, a third power divider for dividing an output based on an output signal from said second vector adjuster into N, and a main amplifier having (1) N power amplifiers connected in parallel to amplify the output signal from said first delay circuit and (2) N distortion canceling power combiners for canceling distortion components from output signals from said N power amplifiers by using an output signal from said third power divider.

Yet another aspect of the present invention is a feed forward amplifier according to the third invention comprising an auxiliary amplifier for amplifying the output signal from said second vector adjuster to output the amplified signal to said third power divider, wherein:

said dividing an output based on an output signal from said second vector adjuster into N means dividing said output signal from said auxiliary amplifier into N.

Still yet another aspect of the present invention is a feed forward amplifier wherein each type of devices used as said power amplifiers and a type of a device used as said distortion detecting amplifier are the same.

A further aspect of the present invention is a feed forward amplifier wherein said distortion detecting amplifier has a distortion characteristic relative to normalized output power that is substantially the same as the distortion characteristic of any of said power amplifiers relative to normalized output power.

A still further aspect of the present invention is a feed forward amplifier according to any one of the first invention to the sixth invention wherein substantially all output signals output from said distortion detecting amplifier are output to said distortion canceling power combiner.

BRIEF DESCRIPTION OF THE DRAWINGS

FIGS. 2(a) to 2(g) are frequency spectrum diagrams of signals 101 to 107 at each section of Embodiment 1 of this invention;

DESCRIPTION OF SYMBOLS

Figure 1:
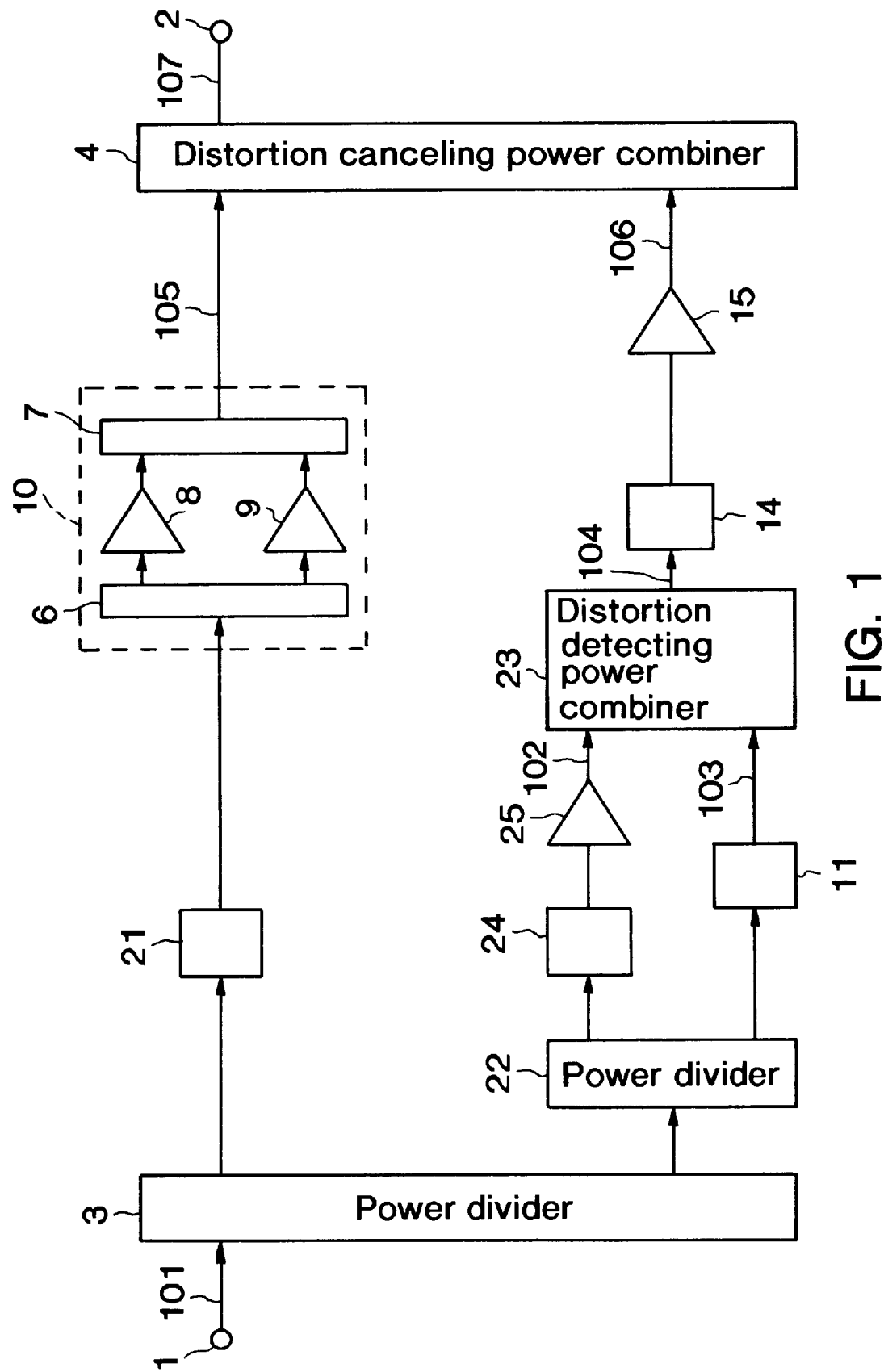
FIG. 1 is a block diagram of a feed forward amplifier according to Embodiment 1 of this invention.

1 . . . Input terminal
2 . . . Output terminal
3, 6, 22, 31 . . . Power divider
4, 32, 33 . . . Distortion canceling power combiner
5, 14, 24 . . . Vector adjuster
7 . . . Output power combiner
8, 9 . . . Power amplifier
10 . . . Main amplifier
11, 13, 21 . . . Delay circuit
12, 23 . . . Distortion detecting power combiner
15 . . . Auxiliary amplifier
25 . . . Distortion detecting amplifier

DETAILED DESCRIPTION OF THE PREFERRED EMBODIMENTS

This invention is described below with reference to the drawings showing its embodiments.

Embodiment 1

FIG. 1 is a block diagram of a feed forward amplifier according to Embodiment 1 of this invention. In this figure, 1 is an input terminal, 2 is an output terminal, 3, 6, and 22 are power dividers, 4 is a distortion canceling power combiner, 7 is an output power combiner, 8 and 9 are power amplifiers, 11 and 21 are delay circuits, 14 and 24 are vector adjusters, 15 is an auxiliary amplifier, 23 is a distortion detecting power combiner, and 25 is a distortion detecting power amplifier. The power divider 3 is a first power divider, the delay circuit 21 is a first delay circuit, the power divider 22 is a second power divider, the vector adjuster 24 is a first vector adjuster, and the delay circuit 11 is a second delay circuit. In addition, the power divider 6, the output power combiner 7, and the power amplifiers 8 and 9 constitute a main amplifier 10. The power amplifiers 8 and 9 and the distortion detecting amplifier 25 each comprise the same device.

The operation of the feed forward amplifier of this configuration is described below with reference to the drawings.

First, the power divider 3 divides an input signal 101 into two. This input signal 101 is input from the input terminal 1 and containing multi-channel components. One of the divided output signals is transferred via the delay circuit 21 to the main amplifier 10, which then amplifies this signal. The amplified signal is input to the distortion canceling power combiner 4 (in FIG. 1, reference numeral 105 designates the signal input to the distortion canceling power combiner 4). Due to the non-linearity of the main amplifier 10, the signal 105 contains not only the input signal components but also distortion components resulting from intermodulation. In addition, the power divider 22 further divides the other divided signal into two, and one of the output signals is transferred via the vector adjuster 24 to the distortion detecting amplifier 25, which then amplifies this signal (in FIG. 1, reference numeral 102 designates the signal amplified by the distortion detecting amplifier 25). At this point, by inputting to the distortion detecting amplifier 25 power at the same level as in the power amplifiers 8 and 9 in the main amplifier 10, the signal 102 is output that has the same frequency spectrum as an output signal 105 from the main amplifier 10 (but a different power level, that is, a different amplitude). The other output signal divided by the power divider 22 is transferred via the delay circuit 11 to the distortion detecting power combiner 23, which then combines this signal with an output signal from the distortion detecting amplifier 25 (in FIG. 1, reference numeral 103 designates the signal input to the distortion detecting power combiner 23). By adjusting the vector adjuster 24 and the delay circuit 11 so that the input signal components of the signals 102 and 103 have an equal amplitude and opposite phases, a signal 104 consisting of only the distortion components with the input signal components cancellation is output from the distortion detecting power combiner 23.

FIGS. 2(*a*) to 2(*g*) show the frequency spectra of the signals at each section.

Next, the signal output from the distortion detecting power combiner 23 and consisting of the distortion components is transferred via the vector adjuster 14 to the auxiliary amplifier 15, which then amplifies this signal. The amplified signal is input to the distortion canceling power combiner 4, which then combines this signal with an output signal from the main amplifier 10. By adjusting the vector adjuster 14 and the delay circuit 21 so that the distortion components of both signals have an equal amplitude and opposite phases, a signal consisting of only the input signal components with the distortion components cancellation is output from the distortion canceling power combiner 4 to the output terminal 2.

Figure 6:
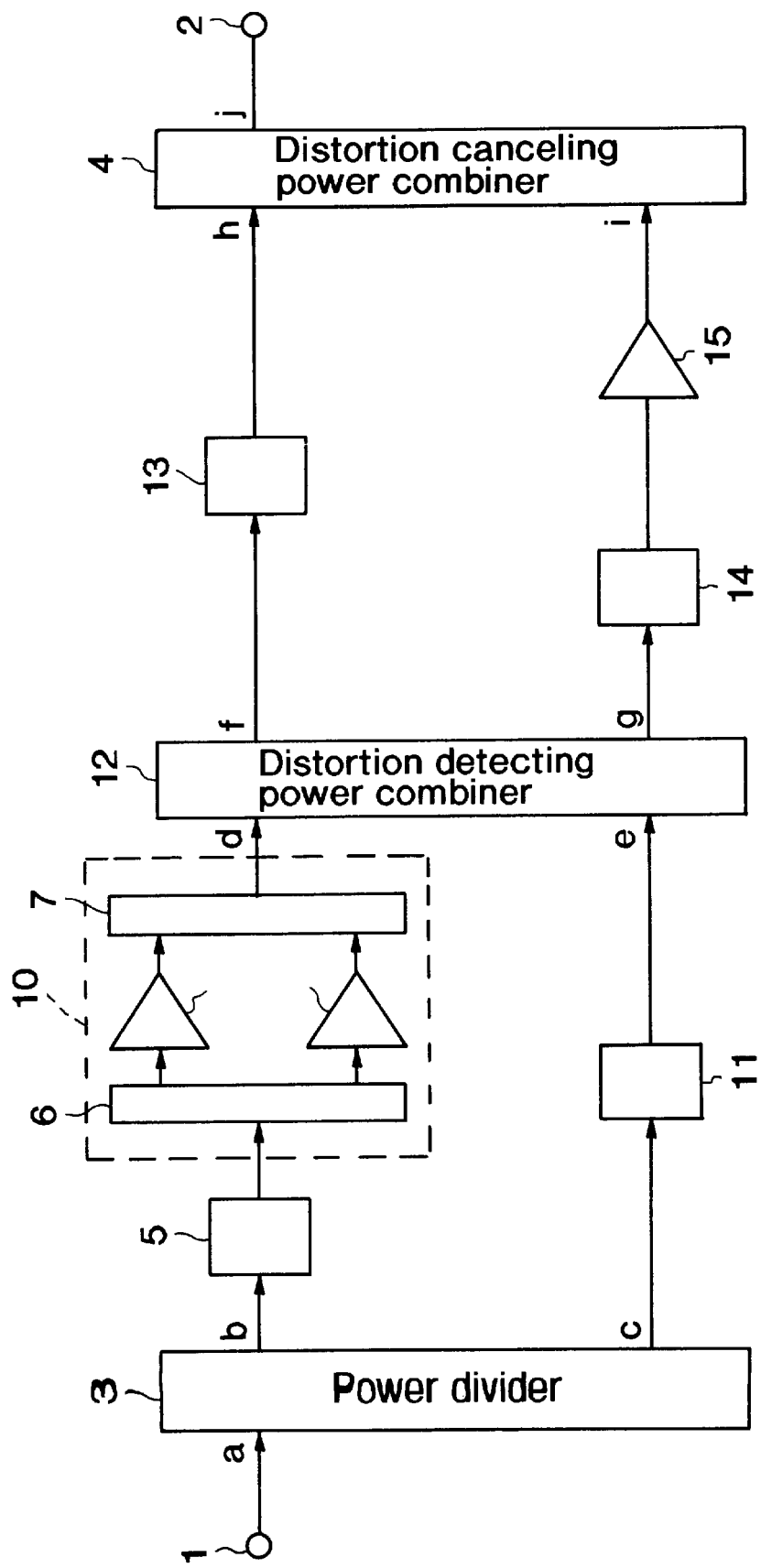
FIG. 6 is a block diagram of a conventional feed forward amplifier.
Figure 7B:
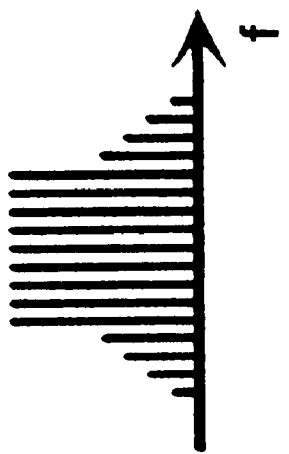
FIGS. 7(a) to 7(d) are frequency spectrum diagrams of signals at ports (a), (d), (g), and (j) of the conventional feed forward amplifier shown in FIG. 6.
Figure 7D:
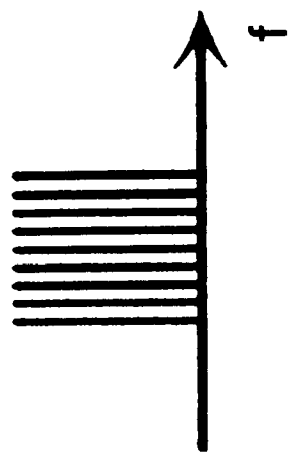
Figure 7A:
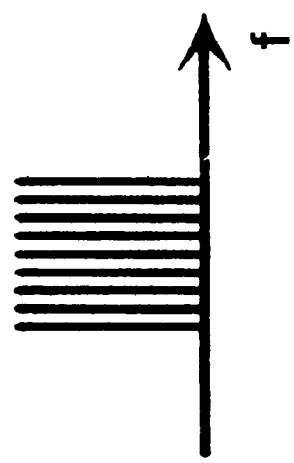
Figure 7C:
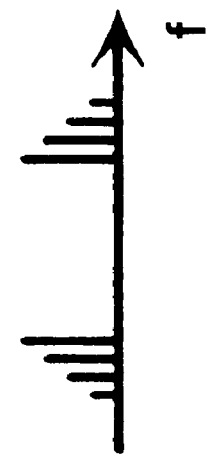

Compared to the conventional feed forward amplifier in FIG. 6, the configuration in FIG. 1 omits the distortion detecting power combiner otherwise located after the main amplifier and locates the delay circuit before the main amplifier to reduce losses occurring after the main amplifier in order to improve the efficiency of the entire feed forward amplifier.

Although Embodiment 1 has been described in conjunction with the example in which the main amplifier is configured by combining the two power amplifiers in parallel, this invention is not limited to this aspect and the main amplifier may be configured using a single power amplifier. In this case, the power divider 6 and the output power combiner 7 may be removed.

Although Embodiment 1 has been described in conjunction with the example in which the main amplifier is configured by combining the two power amplifiers in parallel, this invention is not limited to this aspect and the main amplifier may be configured by combining three or more power amplifiers in parallel. In this case, the power divider 6 may be adapted to divide the input signal into the same number as that of the power amplifiers.

Figure 3B:
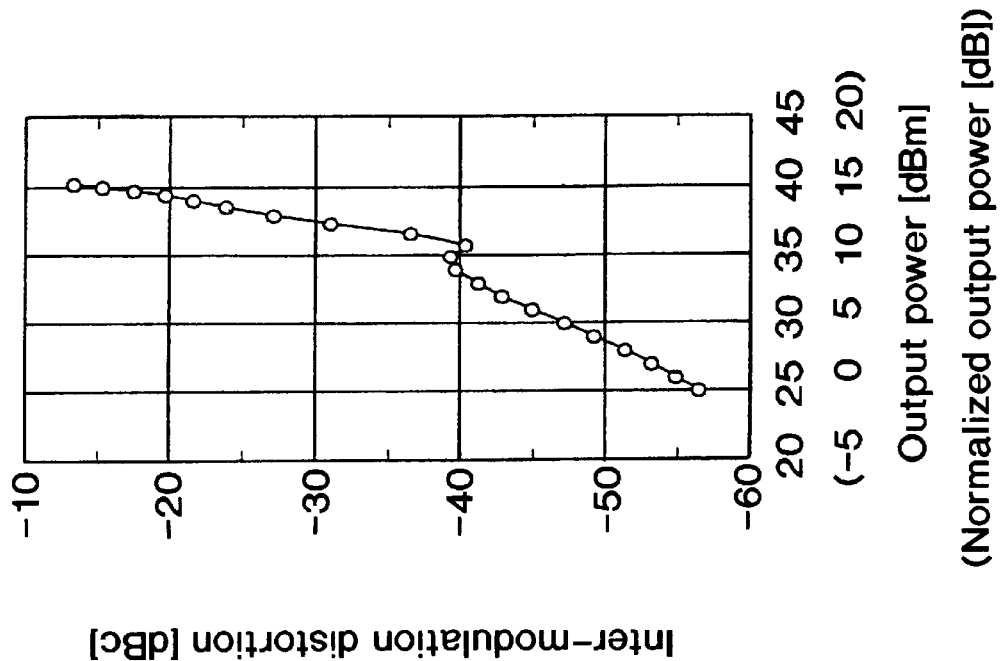
FIG. 3(b) is a graph showing the distortion characteristic of each power amplifier of a main amplifier vs. normalized output power.
Figure 3A:
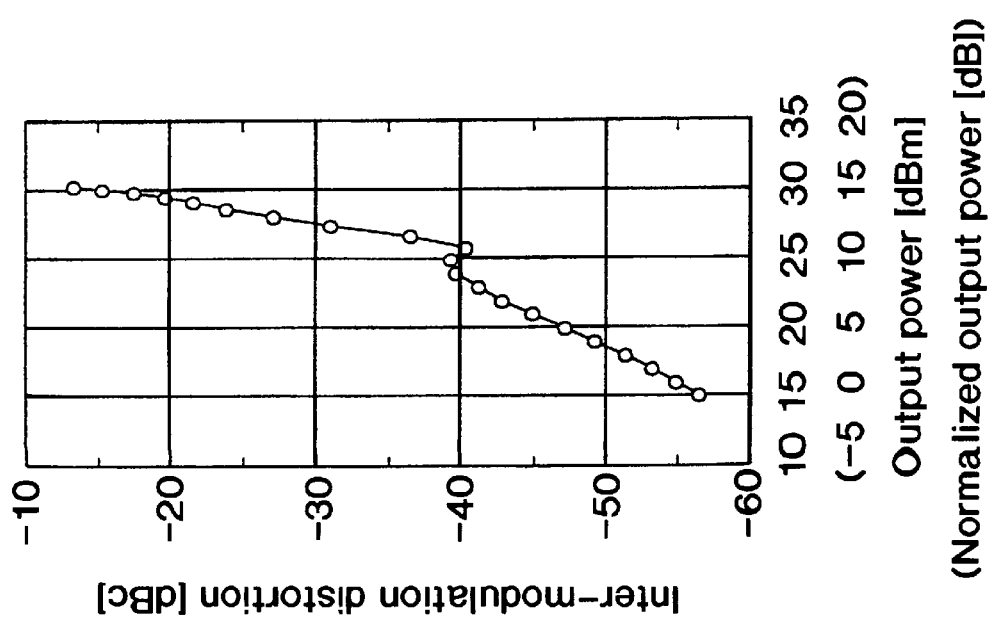
FIG. 3(a) is a graph showing the distortion characteristic of a distortion detecting amplifier vs. normalized output power.

In addition, although in Embodiment 1, the distortion detecting amplifier 25 and the power amplifiers 8 and 9 each comprise the same device, this invention is not limited to this aspect but similar operations can be performed by, for example, configuring the amplifiers in such a way that the distortion characteristic of the distortion detecting amplifier 25 relative to normalized output power (shown in FIG. 3(*a*)) is the same as the distortion characteristic of one of the power amplifiers 8 and 9 relative to normalized output power (shown in FIG. 3(*b*)) and that the output power of the distortion detecting amplifier 25 is lower than that of the power amplifiers 8 or 9.

Embodiment 2

Figure 4:
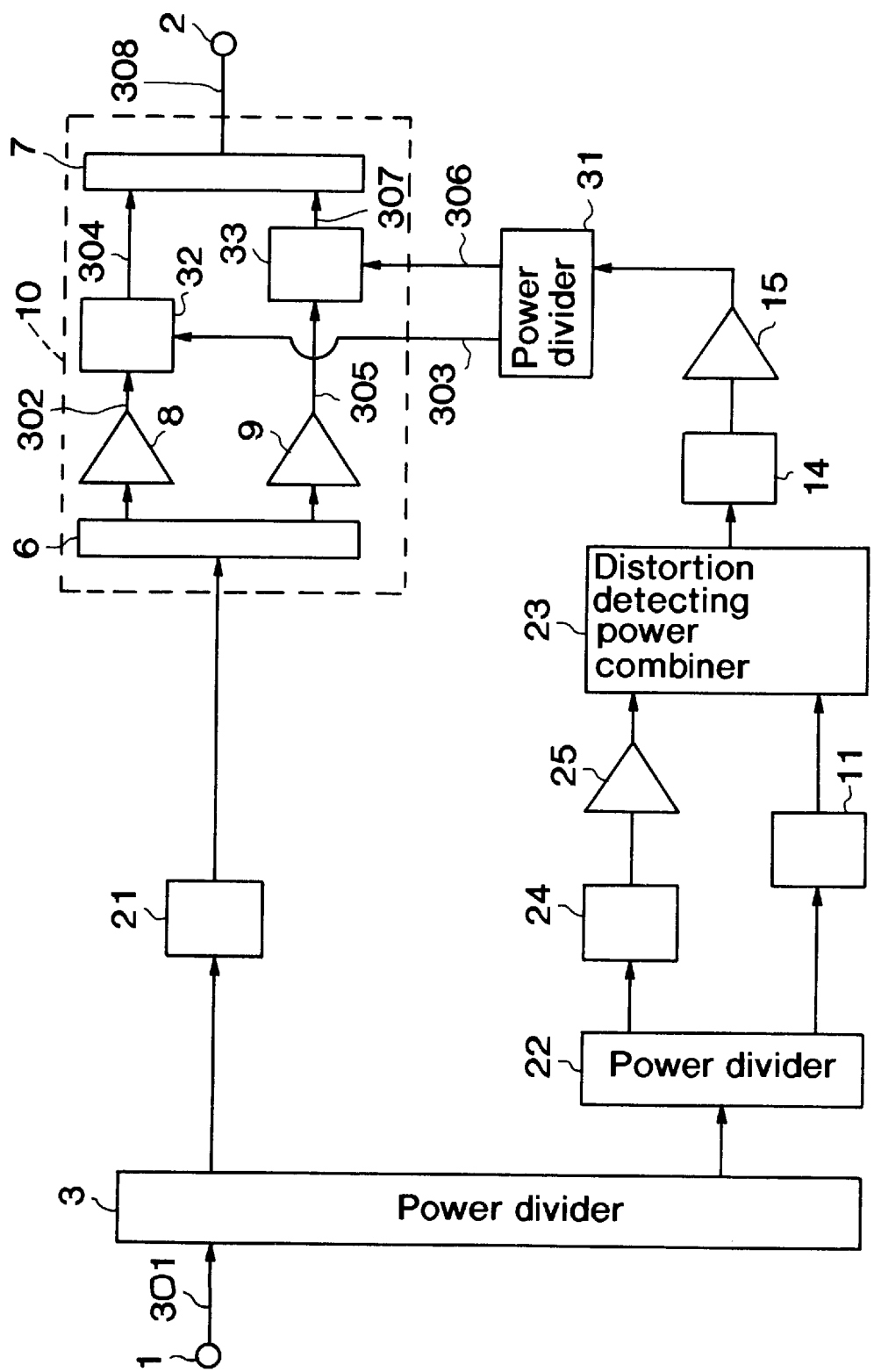
FIG. 4 is a block diagram of a feed forward amplifier according to Embodiment 2 of this invention.
Figure 5A:
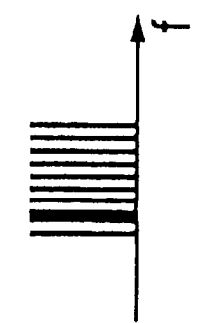
FIGS. 5(a) to (h) are frequency spectrum diagrams of signals 301 to 308 at each section of Embodiment 2 of this invention.
Figure 5B:
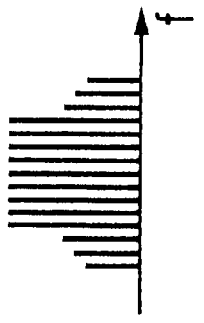
Figure 5C:
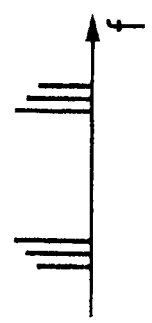
Figure 5D:
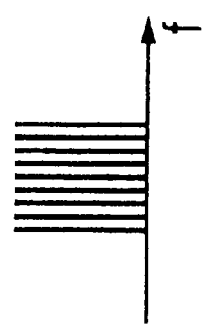
Figure 5E:
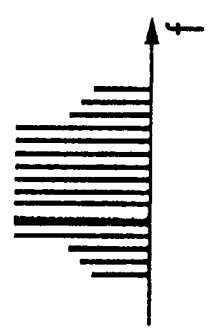
Figure 5F:
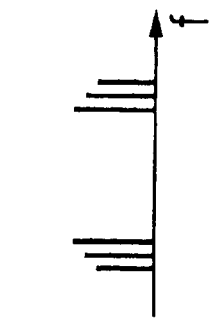
Figure 5G:
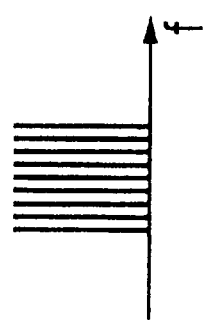
Figure 5H:
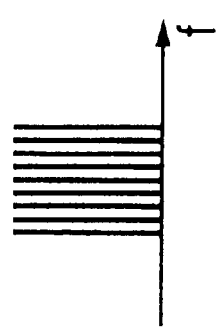

FIG. 4 is a block diagram of a feed forward amplifier according to Embodiment 2 of this invention. In this figure, the same components as in Embodiment 1 have the same reference numerals. In addition, 31 is a power divider that is a third power divider and 32 and 33 are distortion canceling power combiners. The power divider 6, the output power combiner 7, the power amplifiers 8 and 9, and the distortion canceling power combiners 32 and 33 constitute the main amplifier 10. The power amplifiers 8 and 9 and the distortion detecting amplifier 25 each comprise the same device.

The operation of the feed forward amplifier of this configuration is described below with reference to the drawings.

Embodiment 2 of this invention is a feed forward amplifier that cancels the distortion components for each power amplifier of the main amplifier. First, the power divider 3 divides an input signal 301 into two. This input signal 301 is input from the input terminal 1 and containing multi-channel components. One of the divided output signals is transferred via the delay circuit 21 to the power divider 6, which divides this signal into two. The power amplifiers 8 and 9 then amplify the divided signals, respectively. Due to the non-linearity of each of the power amplifiers 8 and 9, the output signal contains not only the input signal components but also distortion components resulting from inter-modulation (in FIG. 4, reference numerals 302 and 305 designate the output signals of the power amplifiers 8 and 9, respectively).

The other signal divided by the power divider 3 is processed as in Embodiment 1, so a signal with only the distortion components amplified is output to the auxiliary amplifier 15. The power divider 31 that divides power depending on the number of power amplifiers in the main amplifier 10 divides the output signal from the auxiliary amplifier 15 into two. The distortion canceling power combiner 32 combines one output signal 303 of the two output signals divided by the power divider 31, with an output signal 302 from the power amplifier 8. The distortion canceling power combiner 33 combines the other output signal 306 with an output signal 305 from the power amplifier 9. By adjusting the vector adjuster 14 and the delay circuit 21 so that the distortion components of both combined signals have an equal amplitude and opposite phases, signals 304 and 307 consisting of only the input signal components with the distortion components cancellation are output from the distortion canceling power combiners 32 and 33, respectively. The output power combiner 7 then combines the output signals 304 and 307 from the distortion canceling power combiners 32 and 33 together and outputs to the output terminal 2 a signal 308 consisting of only the input signal components.

FIGS. 5(*a*) to 5(*h*) show the frequency spectra of the signals at each section.

Thus, the configuration in FIG. 4 improves the efficiency of the entire feed forward amplifier as in Embodiment 1.

Although Embodiment 2 has been described in conjunction with the example in which the main amplifier is configured by combining the two power amplifiers in parallel, this invention is not limited to this aspect and the main amplifier may be configured by combining three or more power amplifiers in parallel. In this case, the power divider 6 may be adapted to divide the input signal into the same number as that of the power amplifiers.

In addition, although in Embodiment 2, the distortion detecting amplifier 25 and the power amplifiers 8 and 9 each comprise the same device (that is, each type of devices used as said power amplifiers 8 and 9 and the type of the device used as said distortion detecting amplifier 25 are the same), this invention is not limited to this aspect but similar operations can be performed by, for example, configuring the apparatus in such a way that the distortion characteristic of the distortion detecting amplifier 25 relative to normalized output power is the same as the distortion characteristic of one of the power amplifiers 8 and 9 relative to normalized output power.

As is apparent from the above description, in addition to the plurality of power amplifiers of the main amplifier connected in parallel, this invention includes the amplifier for detecting the distortion components, having a distortion characteristic in a predetermined relationship with the distortion characteristic of the main amplifier. This configuration has the advantages of omitting the distortion detecting power combiner otherwise located after the main amplifier and locating the delay circuit before the main amplifier to reduce losses occurring after the main amplifier in order to improve the efficiency of the entire feed forward amplifier.

What is claimed is:

1. A feed forward amplifier comprising:

a first power divider for dividing an input signal into two divided signals, a first delay circuit for delaying one of the divided signals from the first power divider, a main amplifier having one power amplifier or a plurality of power amplifiers connected in parallel for amplifying an output signal from said first delay circuit, a second power divider for dividing the other divided signal from said first power divider into two output signals, a first vector adjuster for adjusting an amplitude and phase of one of said output signals from the second power divider, a distortion detecting amplifier for amplifying an output signal from the first vector adjuster, a second delay circuit for delaying the other output signal from the second power divider, a distortion detecting power combiner for combining an output signal from said distortion detecting amplifier and an output signal from said second delay circuit, and providing output distortion components, a second vector adjuster for adjusting an amplitude and phase of said output distortion components from the distortion detecting power combiner, and a distortion canceling power combiner for canceling distortion components from an output signal from said main amplifier based on an output signal from said second vector adjuster.

2. A feed forward amplifier according to claim 1 comprising an auxiliary amplifier for amplifying the output signal from said second vector adjuster to output the amplified signal to said distortion canceling power combiner, wherein:

said canceling distortion components from the output signal from said main amplifier based on the output signal from said second vector adjuster means canseling distortion components from the output signal from said main amplifier by using said output signal from said auxiliary amplifier.

3. A feed forward amplifier comprising:

a first power divider for dividing an input signal into two, a first delay circuit for delaying one of the output signals from the first power divider, a second power divider for dividing the other output signal from said first power divider into two, a first vector adjuster for adjusting an amplitude and phase one of output signals from the second power divider, a distortion detecting amplifier for amplifying an output signal from the first vector adjuster, a second delay circuit for delaying the other output signal from the second power divider, a distortion detecting power combiner for combining an output signal from said distortion detecting amplifier and an output signal from said second delay circuit, and for outputting distortion components, a second vector adjuster for adjusting an amplitude and phase of an output signal from the distortion detecting power combiner, a third power divider for dividing an output based on an output signal from said second vector adjuster into N, and a main amplifier having (1) N power amplifiers connected in parallel to amplify the output signal from said first delay circuit and (2) N distortion canceling power combiners for canceling distortion components from output signals from said N power amplifiers by using an output signal from said third power divider.

4. A feed forward amplifier according to claim 3 comprising an auxiliary amplifier for amplifying the output signal from said second vector adjuster to output the amplified signal to said third power divider, wherein:

said dividing an output based on an output signal from said second vector adjuster into N means dividing said output signal from said auxiliary amplifier into N.

5. A feed forward amplifier according to claim 1, wherein each type of devices used as said power amplifiers and a type of a device used as said distortion detecting amplifier are the same.

6. A feed forward amplifier according to claim 1, wherein said distortion detecting amplifier has a distortion characteristic relative to normalized output power that is substantially the same as the distortion characteristic of any of said power amplifiers relative to normalized output power.

7. A feed forward amplifier according to claim 1, wherein substantially all output signals output from said distortion detecting amplifier are output to said distortion canceling power combiner.

8. A feed forward amplifier according to claim 2 wherein each type of devices used as said power amplifiers and a type of a device used as said distortion detecting amplifier are the same.

9. A feed forward amplifier according to claim 3 wherein each type of devices used as said power amplifiers and a type of a device used as said distortion detecting amplifier are the same.

10. A feed forward amplifier according to claim 4 wherein each type of devices used as said power amplifiers and a type of a device used as said distortion detecting amplifier are the same.

11. A feed forward amplifier according to claim 2 wherein said distortion detecting amplifier has a distortion characteristic relative to normalized output power that is substantially the same as the distortion characteristic of any of said power amplifiers relative to normalized output power.

12. A feed forward amplifier according to claim 3 wherein said distortion detecting amplifier has a distortion characteristic relative to normalized output power that is substantially the same as the distortion characteristic of any of said power amplifiers relative to normalized output power.

13. A feed forward amplifier according to claim 4 wherein said distortion detecting amplifier has a distortion characteristic relative to normalized output power that is substantially the same as the distortion characteristic of any of said power amplifiers relative to normalized output power.

14. A feed forward amplifier according to claim 2 wherein substantially all output signals output from said distortion detecting amplifier are output to said distortion canceling power combiner.

15. A feed forward amplifier according to claim 3 wherein substantially all output signals output from said distortion detecting amplifier are output to said distortion canceling power combiner.

16. A feed forward amplifier according to claim 4 wherein substantially all output signals output from said distortion detecting amplifier are output to said distortion canceling power combiner.

17. A feed forward amplifier according to claim 5 wherein substantially all output signals output from said distortion detecting amplifier are output to said distortion canceling power combiner.

18. A feed forward amplifier according to claim 6 wherein substantially all output signals output from said distortion detecting amplifier are output to said distortion canceling power combiner.

19. A feed forward amplifier according to claim 9 wherein substantially all output signals output from said distortion detecting amplifier are output to said distortion canceling power combiner.

20. A feed forward amplifier according to claim 12 wherein substantially all output signals output from said distortion detecting amplifier are output to said distortion canceling power combiner.

* * * * *